United States Patent [19]

Cleversey et al.

[11] 4,212,075
[45] Jul. 8, 1980

[54] ELECTRICAL COMPONENT TESTING SYSTEM FOR COMPONENT INSERTION MACHINE

[75] Inventors: Gerald W. Cleversey, Topsfield; Robert J. Duncan, Magnolia; George H. Medidge, Jr., North Andover; Jean A. Fleming, South Hamilton, all of Mass.

[73] Assignee: USM Corporation, Farmington, Conn.

[21] Appl. No.: 950,056

[22] Filed: Oct. 10, 1978

[51] Int. Cl.² .............................................. G06F 11/00
[52] U.S. Cl. .................................... 364/580; 364/489; 324/73 AT
[58] Field of Search ............... 364/580, 481, 488–490; 324/73 R, 73 AT, 73 PC; 235/302, 302.1; 29/703, 741

[56] References Cited

U.S. PATENT DOCUMENTS

| | | | |
|---|---|---|---|
| 3,657,527 | 4/1972 | Kassabgi et al. | 235/302 |
| 3,727,284 | 4/1973 | Ragard et al. | 29/741 X |
| 3,764,995 | 10/1973 | Helf, Jr. et al. | 364/489 X |
| 3,777,129 | 12/1973 | Mehta | 364/580 X |
| 3,832,535 | 8/1974 | Vito | 235/302 |
| 3,851,161 | 11/1974 | Sloop | 324/73 PC X |
| 4,039,813 | 8/1977 | Kregness | 235/302 |
| 4,055,801 | 10/1977 | Pike et al. | 324/73 AT X |
| 4,063,347 | 12/1977 | Woodman, Jr. | 29/703 X |
| 4,081,743 | 3/1978 | Madden | 324/73 AT X |
| 4,108,358 | 8/1978 | Niemaszyk et al. | 324/73 AT X |

OTHER PUBLICATIONS

Card Tester Clips Onto ICs; Electronics Review, Jul. 22, 1976, p. 46.

Primary Examiner—Edward J. Wise
Attorney, Agent, or Firm—William F. White; Richard B. Megley; Vincent A. White

[57] ABSTRACT

A testing system is provided within a component insertion machine for testing a component immediately prior to its insertion into a printed circuit board. The insertion of the component is conditioned upon the successful passage of one or more tests that are dictated for the particular component. Each test includes the selective application of one or more test signals to predefined inputs on the component. Each test futhermore includes a limited application of a particular power condition. A successful passage of the prescribed tests will result in an authorization to insert the component into the printed circuit board.

33 Claims, 11 Drawing Figures

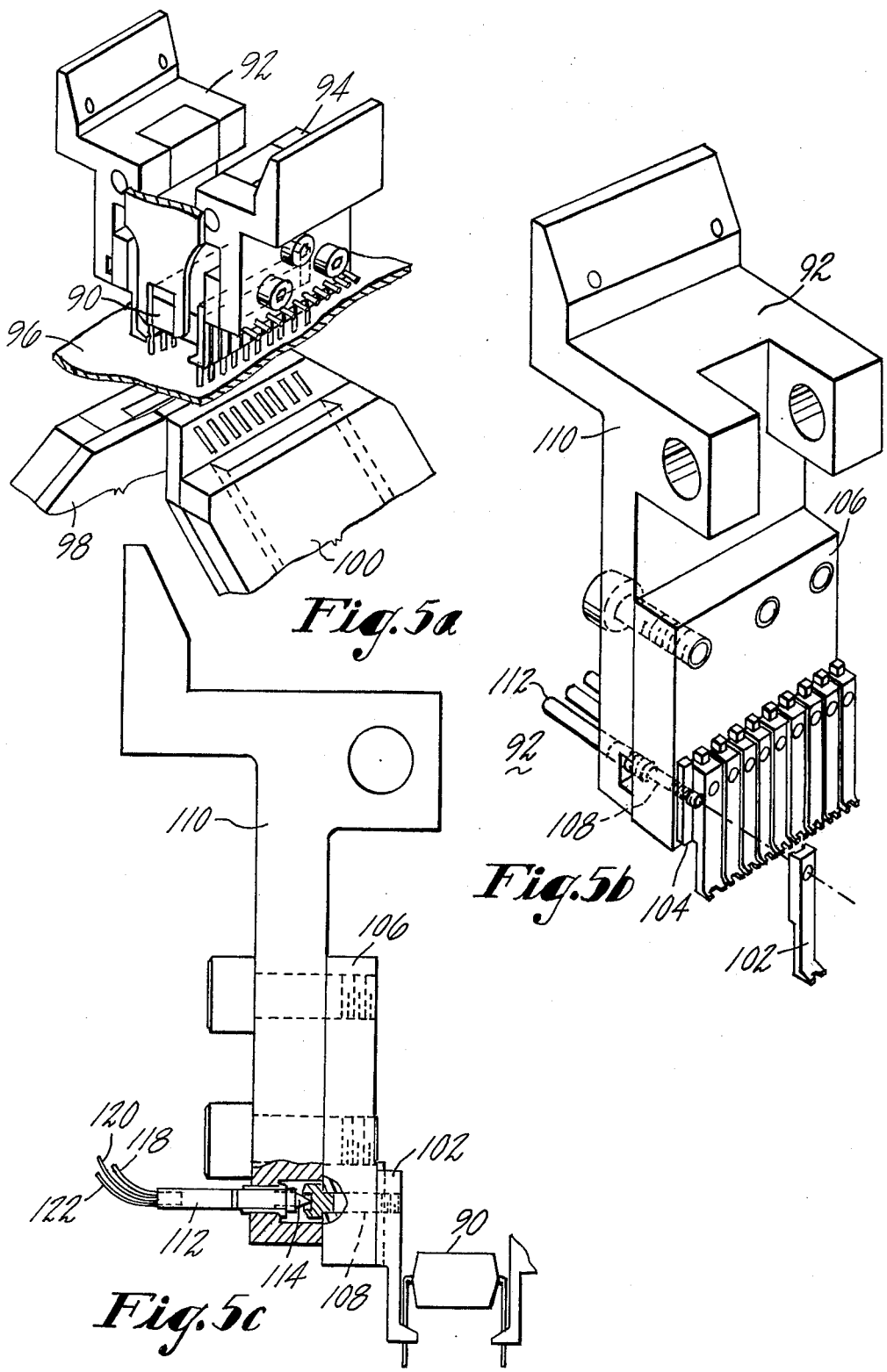

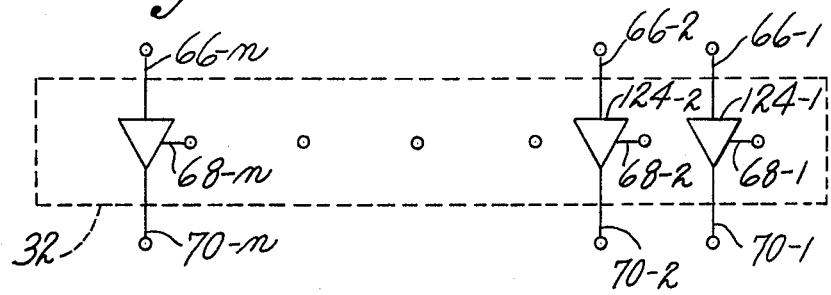
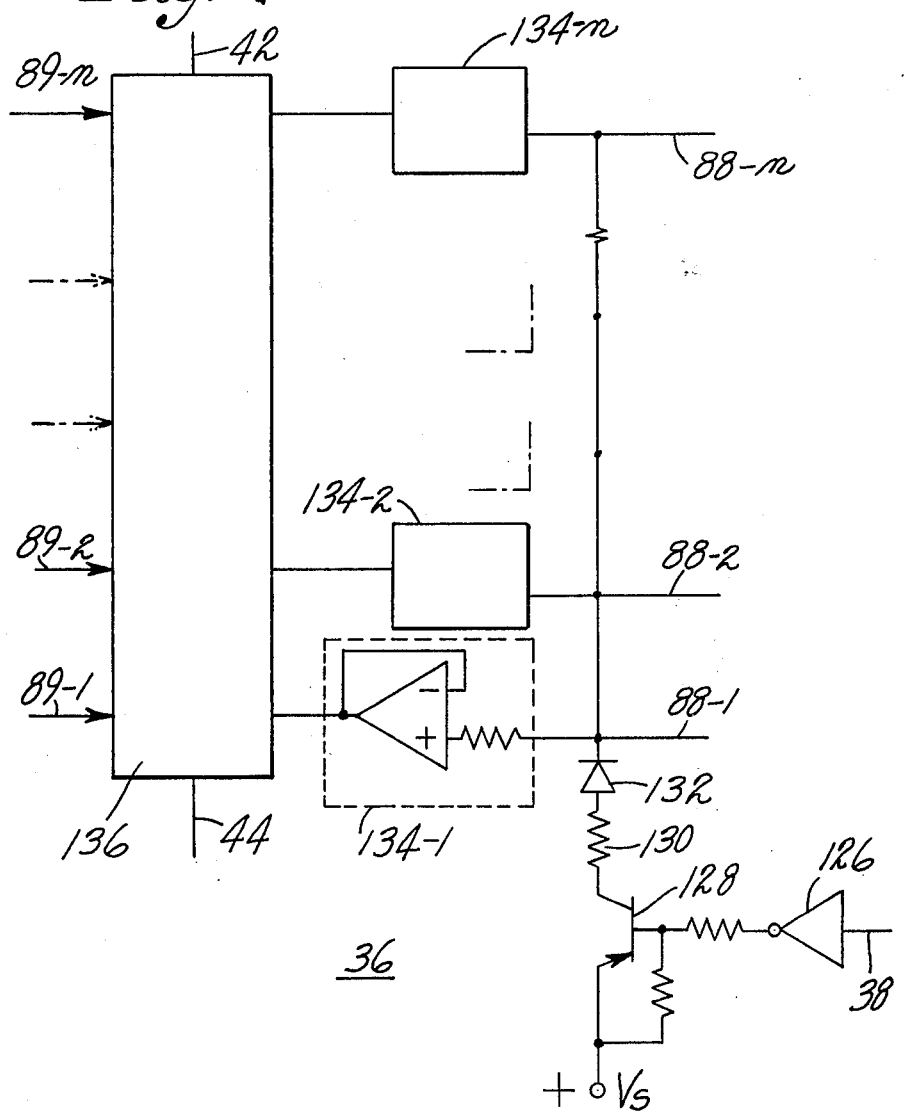

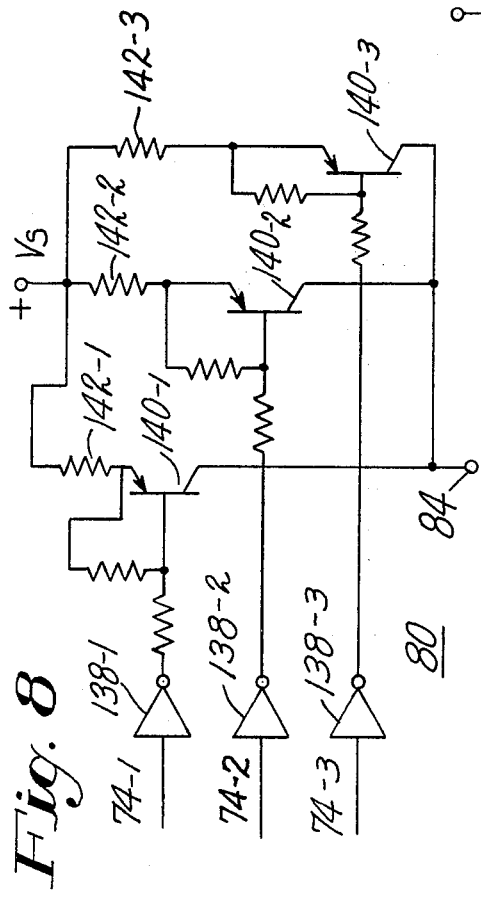
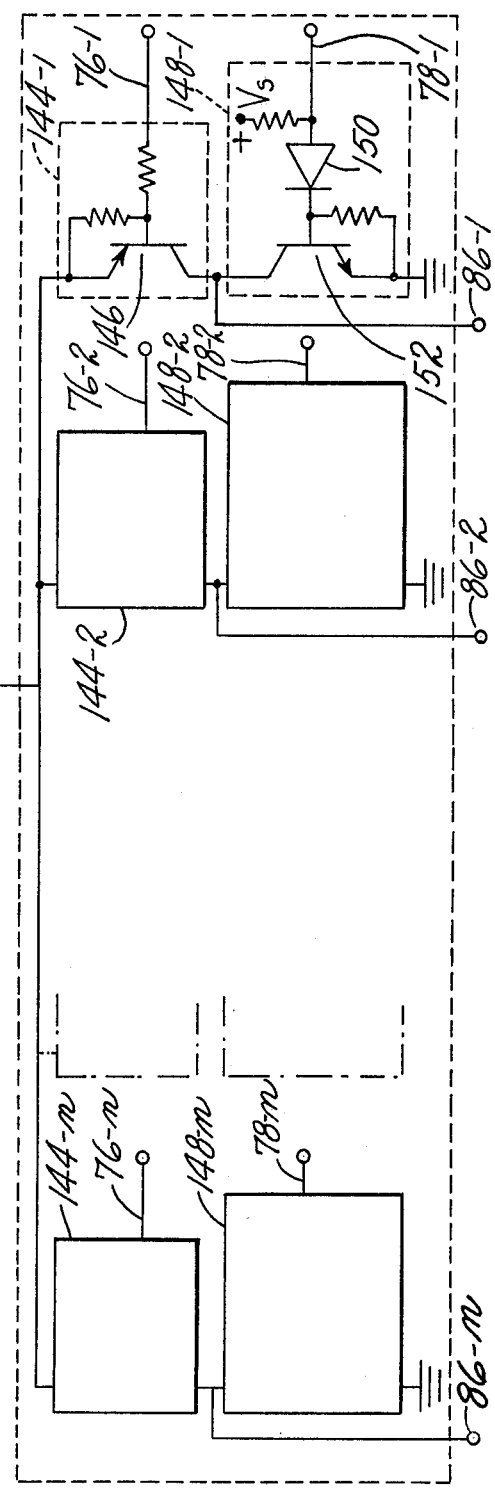
Fig. 8
Fig. 9

ELECTRICAL COMPONENT TESTING SYSTEM FOR COMPONENT INSERTION MACHINE

FIELD OF THE INVENTION

This invention relates to machinery which inserts one or more electrical components into a receiving medium such as a printed circuit board. In particular, this invention relates to the testing and verification of an electrical component prior to its insertion into the receiving medium.

BACKGROUND OF THE INVENTION

Electrical and electronic components are being produced in ever increasing numbers by many different manufacturers today. These manufacturers often subject their products to rigorous quality control standards during and following production. Notwithstanding this application of quality control standards, these electrical and electronic components still experience various rejection rates by their ultimate users.

The ultimate users often combine several of these electrical or electronic components into a specific circuit configuration which performs one or more functions within an overall electrical or electronic device. The specific circuit configuration in most cases is dictated by a printed circuit board which receives the particular components. The particular components may be automatically inserted into the printed circuit board by a component insertion machine if so desired. This latter approach is usually undertaken by a device manufacturer who is engaged in volume production.

As can be appreciated, it is important to isolate any problem associated with the automatic loading of components in a high volume production situation. This would include any misloading of the wrong components into the component insertion machine. This would furthermore include the loading of the right components in a wrong manner, i.e. by misorienting them so that they are oriented in the wrong direction for insertion. This would still furthermore include the detection of a component which was either defective from the original component manufacturer or damaged through subsequent handling by the device manufacturer.

The need to check electrical components for the aforementioned reasons has always been offset against the requirements for an expeditious handling and insertion of components by the manufacturer of the electrical or electronic device. This has heretofore governed the lack of comprehensive testing at the point of component insertion. In this regard, testing has usually been limited to a checking of the orientation of a given component by detecting a notch at the forward end of the component. The component is thereafter inserted if the correct orientation is noted.

OBJECTS OF THE INVENTION

It is an object of this invention to provide a component insertion machine with the capability of testing electrical components prior to their insertion into a receiving media.

It is another object of this invention to provide a component insertion machine with the capability of measuring the electrical response characteristics of each component prior to insertion into a receiving medium.

It is still another object of this invention to provide a component insertion machine with the capability of imposing unique test conditions on each electrical component prior to insertion into a receiving medium.

It is a still further object of this invention to provide a component insertion machine with the capability of imposing unique test conditions on each electrical component for a predetermined length of time prior to insertion into a receiving medium.

SUMMARY OF THE INVENTION

The above and other objects are achieved according to the present invention by locating a plurality of electrical contacts within a pair of finger grippers which normally hold the component immediately prior to its insertion into the receiving medium. The component is aligned with respect to these electrical contacts when initially gripped by the pair of finger grippers. According to the invention, one or more of the electrical contacts are caused to transmit test signals to the component. Different electrical contacts monitor the response of the component to these test signals. The application of the test signals and the monitoring of the component response thereto are dictated by a selective test controller. The selective test controller is operative to dictate one or more different tests requiring different responses thereto by each component.

In a preferred embodiment, the tests consist of applying logic level signals to selected pins of a given integrated circuit component. Each test furthermore consists of momentarily applying particularly selected power and ground levels to the integrated circuit component. The pin responses of the integrated circuit are compared with a truth table for the particular integrated circuit component.

In the event that the tested component does not check out, the selective component test control is operative to alert the main control of the component insertion machine. The main control will thereafter suspend any further action and will moreover notify the operator of the improper test result.

BRIEF DESCRIPTION OF THE DRAWINGS

The above and other features of the invention will now be particularly described with reference to the accompanying drawings, in which:

FIGS. 5a, 5b and 5c illustrate electrically sensitive finger grippers within the selective component test control of FIG. 3.

FIG. 6 illustrates the test signal gating within the selective component test control of FIGS. 2 and 3.

FIG. 7 illustrates the compare circuit present in the selective component test control of FIG. 3.

FIG. 8 illustrates the current generator present in the selective component test control of FIG. 3.

FIG. 9 illustrates the ground and current contact selection circuit present in the selective component test control of FIG. 3.

DESCRIPTION OF THE PREFERRED EMBODIMENT

Figure 1:
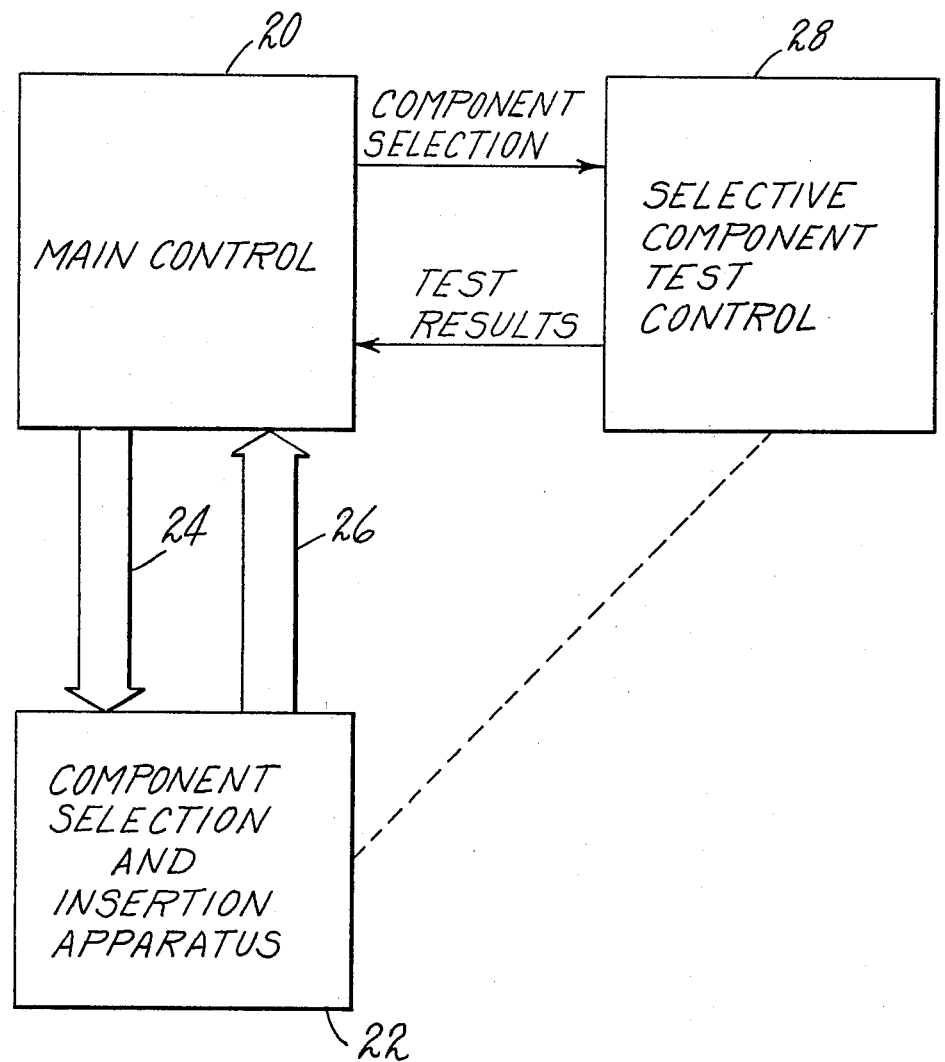
FIG. 1 is an overall block diagram of a component insertion machine according to the present invention.

Referring to FIG. 1, a component insertion machine according to the present invention is illustrated in generalized block diagram form. A main control 20 is operative to control a component selection and insertion apparatus 22 via a pair of communication links 24 and 26. It is to be appreciated that the main control 20 and the selection and insertion apparatus 22 are general elements to be found in any modern-day component insertion machine. This is illustrated, for example, by the component insertion machine depicted in U.S. Pat. No. 4,063,347. The machine in the subject patent is operative to select components in a sequential fashion dictated by the main control system. The particularly selected components are in each instance transferred to a component inserting mechanism within the machine. The component is subsequently inserted into a receiving medium such as a printed circuit board. The main control portion of the machine is operative to thereafter select the next component to be inserted.

In accordance with the present invention, the selection of the next component by the main control of a component insertion machine is transmitted to a selective component test control 28. The selective component test control thereafter defines one or more digital tests for the particular component. These tests are applied to the selected component which has been gripped for insertion within the component selection and insertion apparatus 22. The responses of the component to the particular tests are examined within the selective component test control. The selective component test control is operative to transmit the results of the test to the main control 20.

The main control 20 is thereafter operative to authorize an insertion of the component if the test results are positive. The main control 20 will otherwise suspend insertion of the gripped component and alert the operator of the negative test result.

Figure 2:
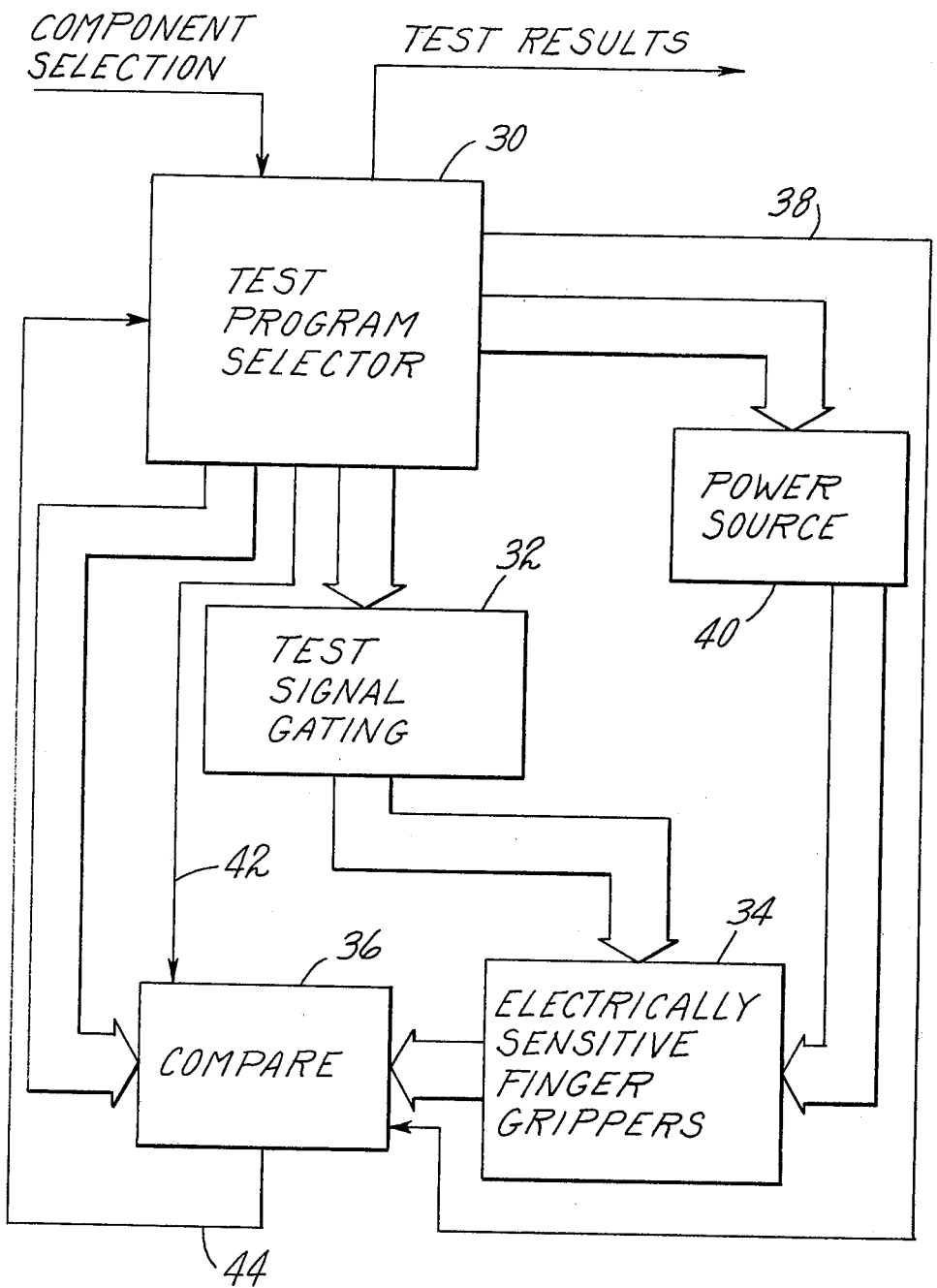
FIG. 2 is a block diagram of the selective component test control.

Referring to FIG. 2, the selective component test control 28 is illustrated in block diagram form. The component selection signal from the main control 20 is applied to a test program selector 30. The test program selector 30 is operative to select and define one or more digital tests in response to the component selection signal. Each test is separately defined by a plurality of bilevel signals generated by the test program selector 30. Certain of these test signals are applied to a test signal gating 32. The test signal gating 32 gates input test signal conditions to a pair of electrically sensitive finger grippers 34. As will be explained in detail hereinafter, the electrically sensitive finger grippers 34 are operative to impose these imput test signal conditions on the gripped component.

The test program selector 30 also applies a set of bilevel signal conditions to a compare circuit 36. The compare circuit 36 furthermore receives an indication as to the type of electrical component that is to be tested directly from the test program selector 30 via a line 38. This latter signal in conjunction with the bilevel signal conditions from the test program selector is operative to configure the compare circuit 36 in a manner which allows for an ultimate comparison with the output signals from the component when under test.

The test program selector 30 also generates a group of bilevel signals which define the particular power and ground conditions for the component which is gripped by the electrically sensitive finger grippers 34. These bilevel signals are applied to a power source 40. The power source 40 is operative to generate a particular power and ground set of conditions which are applied to the electrically sensitive finger grippers 34. The application of power and ground to the component is limited to a predefined time established by the test program selector 30. The various output responses of the thus energized component are compared with an expected set of bilevel signal conditions within the compare circuit 36. This is again done on a timely basis as dictated by a signal from the test program selector 30 via a line 42. The results of this timely comparison are transmitted back to the test program selector 30 via a line 44. The test program selector 30 thereafter either transmits the results of the test to the main control 20 or implements the next successive test program for the particular component.

Figure 3:
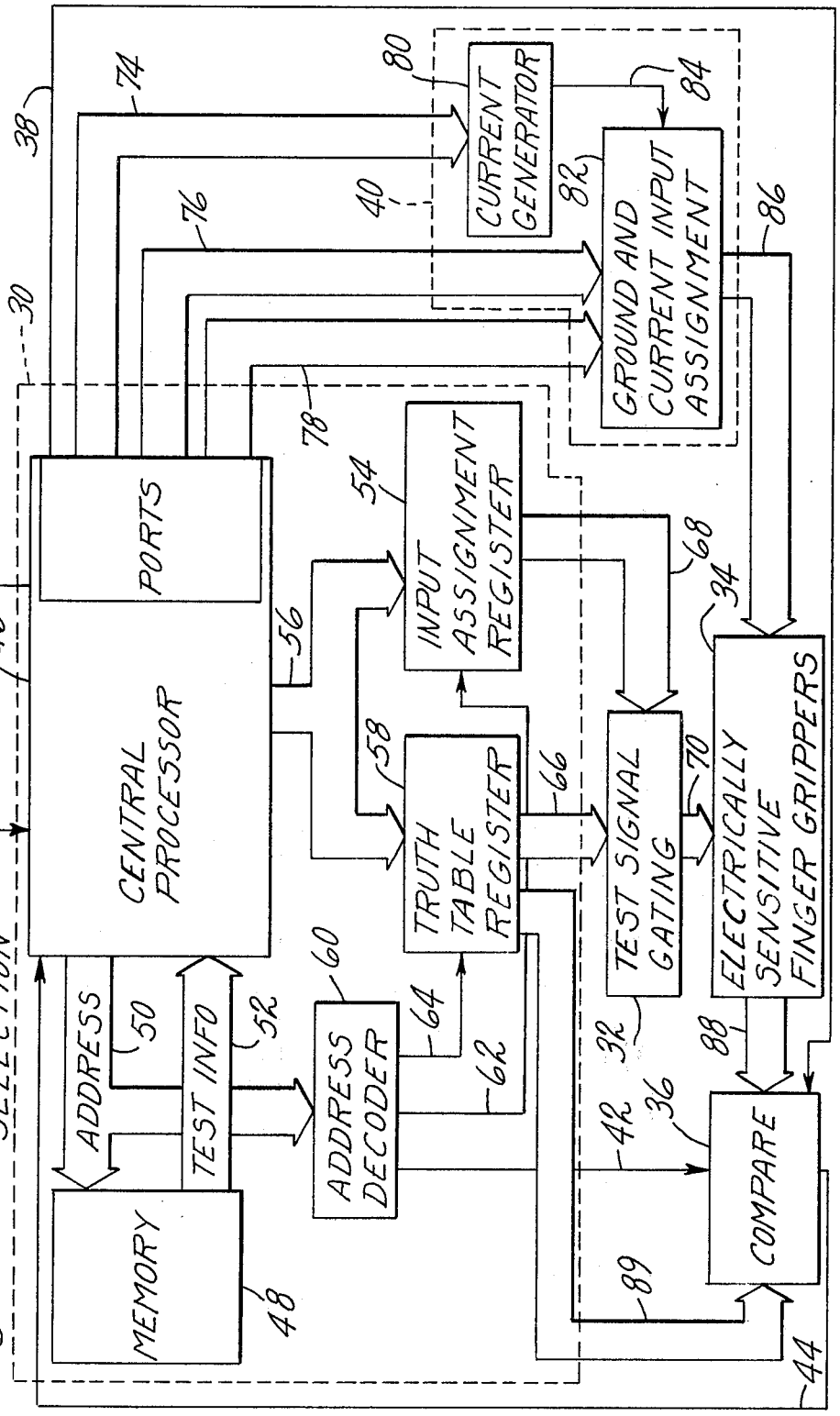
FIG. 3 is a detailed block diagram of the selective component test control of FIG. 2.

Referring now to FIG. 3, the selective component test control 28 is illustrated in still further detail. The various logic elements previously appearing in FIG. 2 have been similarly labeled in FIG. 3. The test program selector 30 and the power source 40 of FIG. 2 have been moreover denoted as dotted outline forms. Referring first to the test program selector 30, it is seen that the same includes a central processor 46 which interfaces with various other logic elements. The central processor 46 is preferably a micro-processor such as the Intel 8080 available from the Intel Corp., Santa Clara. Cal.

The central processor 46 receives the component selection signal from the main control 20 of FIG. 1 as shown. In response thereto, the central processor addresses a memory 48 via an address bus 50. The memory 48 is organized in such a manner so as to contain test information pertaining to the component in a group of successively addressable storage locations. The addressing of these storage locations begins with the address generated by the central processor 46 in response to the component selection signal. Test information is accessed by successively addressing these storage locations via the address bus 50 and reading the test information stored therein via a memory bus 52. A portion of the accessed test information is loaded to an input assignment register 54 via an output bus 56. Another portion of the accessed test information is loaded into a truth table register 58 via the output bus 56. The loading of the test information into the respective registers 54 and 58 is authorized by load signals emanating from an address decoder 60 and appearing on a pair of lines 62 and 64.

The bilevel output signal conditions from the thus loaded input assignment register 54 are applied to the test signal gating 32 via a bus 68 whereas the output signal conditions from the thus loaded truth table register 58 are applied to the test signal gating 32 via a bus 66. The test signal gating is operative to transmit various bilevel signal conditions to the electrically sensitive finger grippers 34 via a bus 70. The electrically sensitive finger grippers 34 are in turn operative to impose these bilevel signal conditions on a gripped component.

Referring again to the central processor 46, it is seen that the right side thereof consists of a number of ports. These ports are common to microprocessors such as the Intel 8080. In accordance with the invention, the central processor 46 is operative to transfer certain test information received from the memory 48 to these ports. This information is in turn largely applied to the power source 40 via a set of port buses 74, 76 and 78. One bit of this information is also used to define a "component designation" signal which appears on the line 38. The "component designation" signal is applied to the compare circuit 36.

The test information appearing on the port bus 74 is applied to a current generator 80. The current generator is operative to subsequently generate a particularly selected current for a predefined time as dictated by the test information on the bus 74. This current is applied to a ground and current input assignment circuit 82 via a line 84. This latter circuit also receives test information from the central processor 46 via the port buses 76 and 78. The ground and current input assignment circuit 82 is subsequently operative to designate particular electrical contacts on the electrically sensitive finger grippers 34 which are to receive the ground and current signal conditions. These signal conditions are applied to the particularly designated electrical contacts via a bus 86. The gripped component responds to the thus imposed ground and current input signal conditions (and to the bilevel test signal conditions imposed by the test signal gating 32) and produces a responsive set of output bilevel signals on a bus 86. These bilevel signal responses on the bus 88 are applied to the compare circuit 36. The compare circuit 36 also receives a set of expected test results from the truth table register 58 via a bus 89. These latter bilevel signal conditions will have been made available to the compare circuit 36 when the truth table register 58 was loaded. The expected bilevel signal conditions from the bus 89 are compared with the actual bilevel test conditions appearing on the bus 88. This is done at such time as a compare authorization signal is received from the address decoder 60 via the line 42. The results of the comparison are transmitted back to the central processor 46 via the line 44. If the comparison result is favorable, the central processor 46 will either implement another test or communicate a positive test result confirmation to the main control 20.

Figure 4:
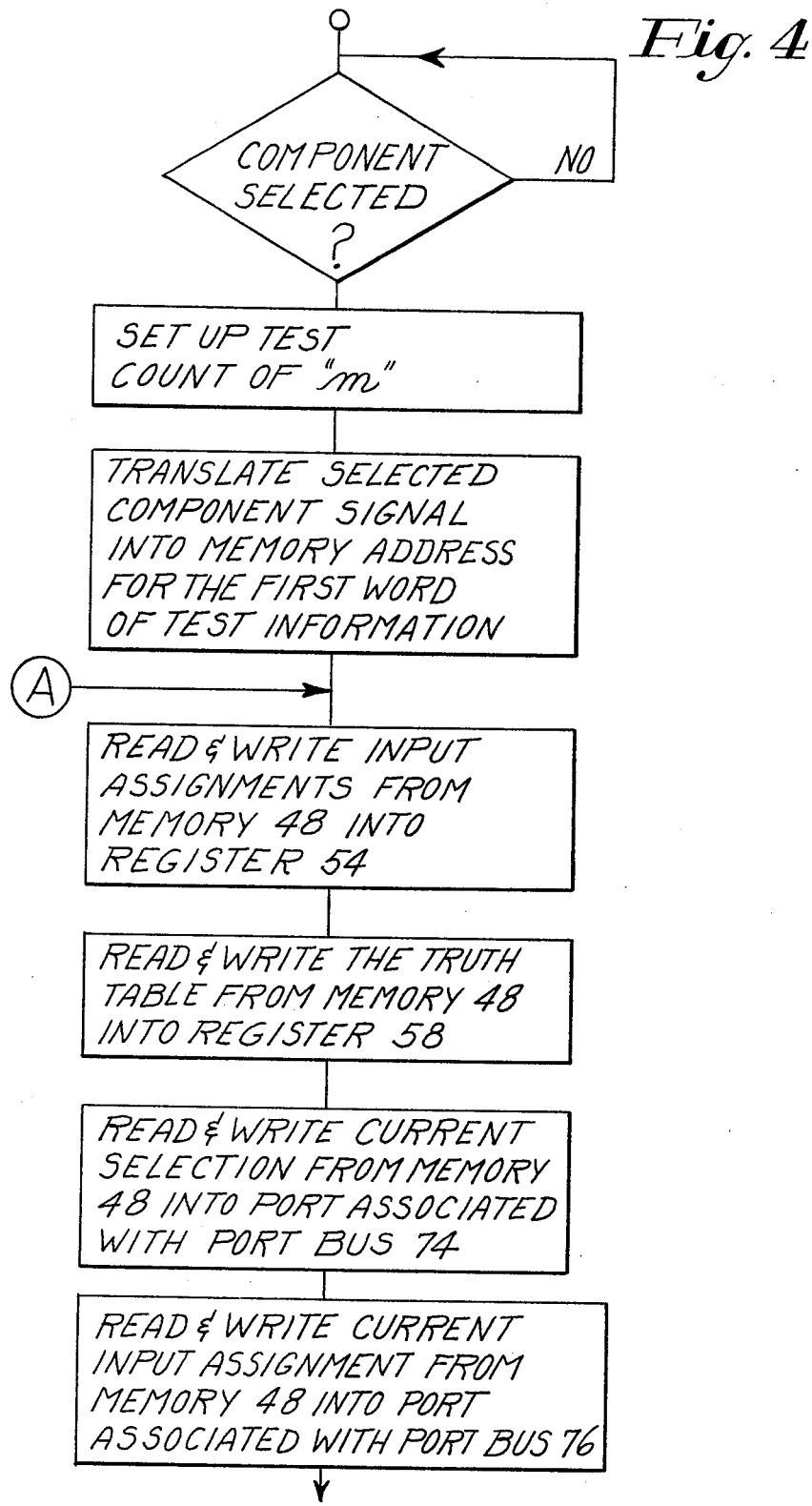
FIG. 4 is a flow chart illustrative of the operations performed by a central processing unit within the selective component test control of FIG. 3.
Figure 4:
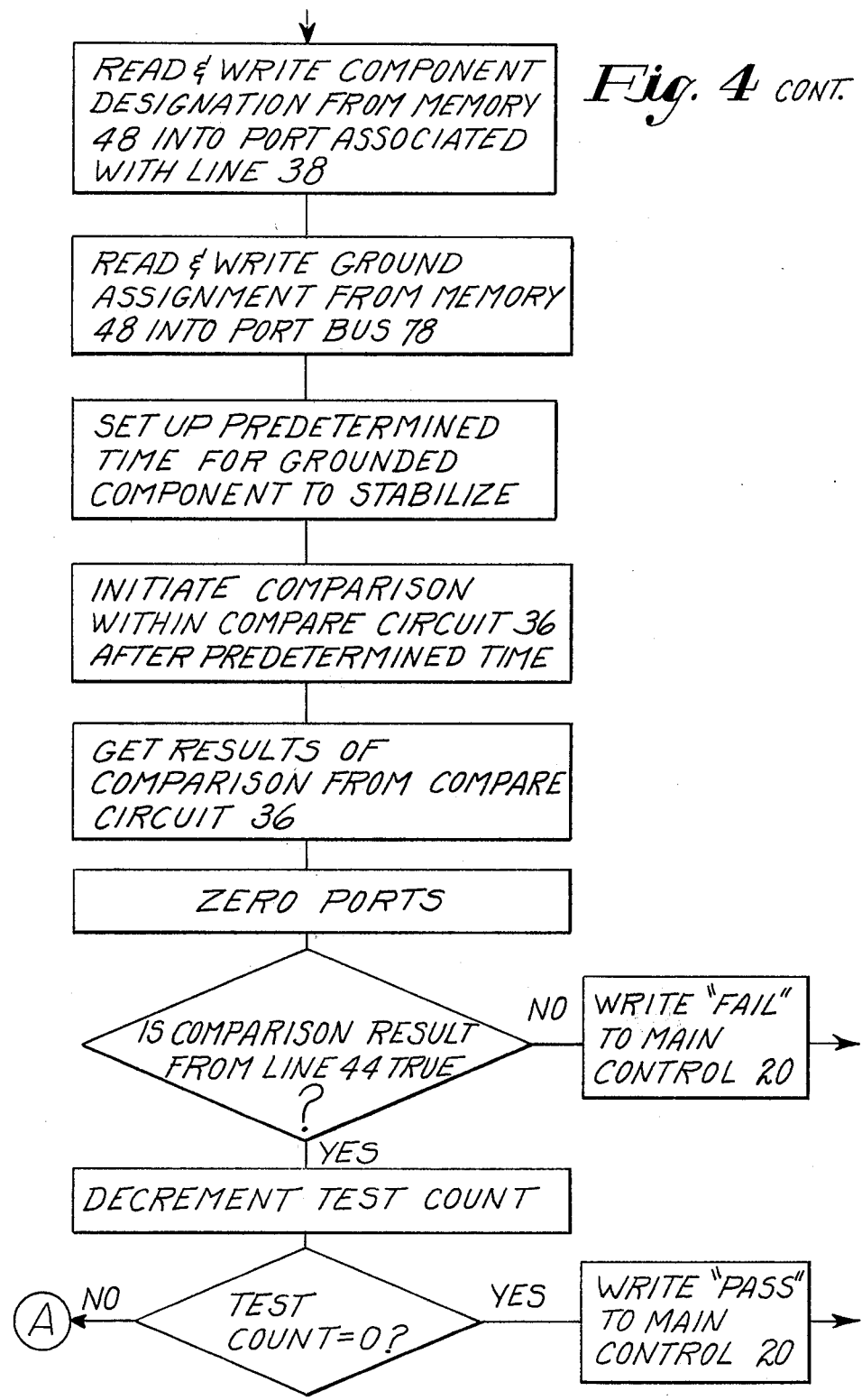

Referring now to FIG. 4, a flow chart description of the operations of the central processor 46 is illustrated. The flow chart begins with a decision as to whether or not a component has been selected. As has been previously indicated, this will be communicated to the central processor 46 by the main control 20. The selection of a component from the main control 20 will moreover indicate the particular component which is thus selected. This is accomplished by having previously assigned a particular number to each component. In other words, each component is previously numbered "0" to "k−1" wherein "k" represents the number of individual components which are to be selected, tested, and inserted. This number will appear in the component signal which is transmitted to the central processor 46.

Following the selection of a component, the central processor 46 is operative to set up a test count of "m". This will allow for more than one test to be subsequently implemented. It has been found that at least two tests are usually necessary in order to adequately test a component prior to insertion.

Following the setting up of a test count of "m", the next step is to translate the selected component signal into a memory address identifying the storage location for the first word of information for the first test. This is preferably accomplished by multiplying the component number by the maximum number of storage locations necessary to store test information for any given component. In other words, if it were necessary to set aside a maximum of sixteen storage locations to perfomr "m" tests on one or more of the components, then the number sixteen would become the multiplication factor. It is to be appreciated that the actual multiplication factor will depend on the word width of the memory 46 as well as the total number of words which are needed to perform the "m" tests. It is furthermore to be noted that if the first memory address of the component numbered "O" is to be other than zero, then this address will have to also be added to the aforementioned multiplication results.

Having thus defined the first address, the central processor is now operative to access the test information at this address. In accordance with a predefined loading of test information into the memory 48, the information present at the first memory address pertains to the input assignments for the particular component. The next step in the flow chart of FIG. 4 is hence the reading and writing of these input assignments into the register 54 of FIG. 3. Referring to FIG. 3, this is accomplished by loading the bus 54 with the particular input assignments and thereafter issuing an address which triggers the address decoder 60 so as to issue a load signal on the line 62 which loads the input assignment information into the input assignment register 54. The input assignments will consist of bilevel signal conditions which will be fed in parallel into the input assignment register 54 at such time as the load signal occurs on the line 62.

In a similar manner, the next step within the overall flow chart of FIG. 4 is that of reading and writing the truth table for the test into the register 56. This is accomplished by reading the truth table information stored in the next few successively addressable memory locations within the memory 48 and thereafter loading the same in parallel into the truth table register 58. The actual loading is accomplished by issuing an address signal on the address bus 50 which is decoded by the address decoder 60 so as to in turn issue a load signal on the line 64.

The next step in the flow chart of FIG. 4 is that of reading and writing the current selection into a designated port. The particularly designated port will be that associated with the port bus 74. This will be followed with the reading and writing of the current input assignment into a designated port associated with the port bus 76. The component designation information will be thereafter written into a port associated with the line 38 of FIG. 3. The next piece of information to be written into a port is that of the ground assignment which is written into the port associated with the port bus 78.

It is to be understood that all information written onto the ports associated with the port buses 74, 76 and 78 is immediately made available to be downstream recipient logic element. In this regard, the current generator 80 is operative to generate the selected current shortly after the information has been written onto the port associated with the port bus 74. This current is subsequently imposed on a particular contact within the electrically sensitive finger grippers 34 shortly after the current input assignment has been written onto the port associated with the port bus 76. Finally, the ground condition will be imposed on a particular contact within the electrically sensitive finger grippers 34 shortly after the ground input assignment has been written onto the port associated with the port bus 78. It is to be appreciated that the gripped component will be subjected to the particular power level defined by the selected current as soon as the ground condition is imposed. A relatively short transient time will be experienced by the thus energized component. This transient time is provided for by setting up a predetermined time to allow the component under test to stabilize. This is illustrated in FIG. 4 as a separate step following the reading and writing of the ground assignment into the port associated with port bus 78.

Referring again to FIG. 4, it is to be noted that the next step is to initiate a comparison within the compare circuit 36 following the expiration of the predetermined time. This is accomplished within the logic of FIG. 3 by issuing an address signal on the address bus 50. This is decoded by the address decoder 60 which in turn issues a compare authorization signal over the line 42 to the compare circuit 36.

The next step to be executed by the central processor 46 according to the flow chart of FIG. 4 is that of getting the result of the comparison which has thus been made by the compare circuit 36. This is accomplished by reading the bilevel signal which is transmitted from the compare circuit 36 to the central processor 46 via the line 44.

The next within the flow chart of FIG. 4 is to zero the ports of the central processor 46. This will effectively cut the power to the component following the completion of the test. It is to be noted that this cutting of the power to the component will occur shortly after the issuance of the compare authorization signal. In this regard, an overall time limitation is imposed on the testing of any component by limiting the amount of time during which the component is subjected to actual power. This time limitation will limit any damage to the gripped component in the event that the same malfunctions during the test.

The next step following the zeroing of the ports is that of noting whether the comparison result from the line 44 is true. If this is answered in the negative, then the central processor 46 is operative to write a "fail" to the main control 20 as the test result. If the answer is yes, then the test count is decremented and the question is asked as to whether or not the test count is equal to zero. If this is answered in the affirmative, then the central processor 46 is operative to write a pass to the main control 20. If the test count is not equal to zero, then the central processor 46 is recycled back to point A of the flow diagram. At this point, the next sequential address to the memory 48 will contain the first word of information for the next test. This particular word of information will either wholly or partly contain the input assignments for the particular test which is to be implemented. The organization of the test information within the memory 48 is the same as for the first test so as to merely be sequentially addressed as the various steps are performed downstream of point A. This performance of subsequent tests will continue until either a failure of a given test is noted or the test count reaches zero. In the latter case, the central processor is operative to write a "pass" to the main control 20 over the line which transmits the test results.

It is to be noted that the main control 20 of FIG. 1 is operative to appropriately respond to either the "pass" or "fail" signals from the central processor 46. In this regard, the main control 20 is preferably a digital computer which is programmed to perform the normal selection and insertion functions of a component insertion machine. This is the normal configuration of a main control within a modern-day component insertion machine. An authorization to proceed to insertion is programmed into the main control. This authorization is made dependent on a receipt of the "pass" signal from the central processor 46. This authorization is never granted in the case of a component failure. The main control, or a separately dedicated alarm circuit, is responsive to a "fail" signal so as to trigger an alarm which alerts the operator of the machine.

Referring to FIG. 5A, a gripped component 90 is illustrated within a pair of electrically sensitive finger grippers 92 and 94. The electrically sensitive finger grippers 92 and 94 are a preferred configuration of the electrically sensitive finger grippers 34 in FIGS. 2 and 3. The gripped component 90 is known as a Dual In-line Pin component commonly referred to as a DIP. The particular DIP component contains ten separate pins along each side. It is to be understood that each of these pins may either constitute an input or an output relative to the particular electrical circuitry contained within the component.

It is furthermore understood that at least two of these pins may require power and ground conditions for the particular electrical circuitry within the component. These pin designations will vary from one DIP to the next. It is therefore incumbent that each pin be separately and individually contacted for the purpose of creating the appropriate signal condition environment for that particular pin.

In accordance with the invention, a successful testing of the gripped electrical component 90 will lead to the insertion of its pins into a receiving media such as the printed circuit board 96 of FIG. 5a. This will in turn be followed by a cutting and clenching of these pins by a pair of moving knives 98 and 100. This will all be dictated by the main control 20 following a successful testing of the component.

Referring to FIG. 5b, the finger gripper 92 is illustrated in detail. The finger gripper 92 is hinged at its upper end through a set of concentric holes as shown. The opposite end of the finger gripper 92 comprises a plurality of individual electrical contacts such as 102 which separately contact the pins of a gripped component. It is to be understood that the actual number of electrical contacts vary depending on the maximum component size that is to be accommodated. The finger gripper 92 contains ten separate electrical contacts which can accommodated one side of the twenty pin DIP of FIG. 5a. The number of contacts present on a pair of electrically sensitive finger grippers will hereinafter be referred to as "n". It being understood that this number may vary depending on the size of the maximum DIP which is to be accommodated.

The lower end of each electrical contact in FIG. 5c is recessed so as to receive a circumferential portion of a pin. Each electrical contact is otherwise constructed so as to carry appropriate load pressures experienced during the insertion of a gripped component on to a printed circuit board. The upper end of each electrical contact such as 102 has an opposite recess therein which fits over an insulated extension 104 of an overall insulative block 106. The insulative extensions are spaced on the insulative block 106 so as to allow for an air space between each electrical contact which fits thereover. In this manner, each electrical contact is electrically isolated from its adjacent electrical contacts.

Each electrical contact has a threaded hole which receives an electrically conductive screw 108 through the insulative block 106. The insulative block 106 is itself bolted to a main structural member 110 of the finger gripper 92. A plurality of spring biased contacts such as 112 are positioned within the structural member 110. The spring biased contacts are so named because of an internal spring biasing which urges an electrically conductive end outwardly. In the case of the spring biased contact 112, this is an electrically conductive end 114 which contacts the head of the electrically conductive screw 108.

The spring biased contact 112 is seen to have three separate electrical leads 118, 120, and 122 extending outwardly from a free terminal end. Each of these electrical leads is commonly connected to the electrically conductive end 114 within the spring biased contact 112. Each of these electrical leads is moreover connected to a particular circuit in FIG. 3. Specifically, the electrical lead 118 is connected to the test signal gating 32. The electrical lead 120 is connected to the compare circuit 36 whereas the electrical lead 122 is connected to the ground and current input assignment circuit 82. In each instance, the particular electrical lead forms part of the bus that runs between the circuit element and the electrically sensitive finger grippers 34 of FIG. 3. The electrical lead 118 forms part of the bus 70 which interconnects the test signal gating 32 with the electrically sensitive finger grippers 34. The electrical lead 120 forms part of the bus 88 which interconnects the compare circuit 36 with the electrically sensitive finger grippers 34. The electrical lead 122 forms part of the bus 86 which interconnects the ground and current input assignment circuit 82 with the electrically sensitive finger grippers 34. In each case, the particular bus carries "n" lines which are individually connected to the respective spring biased contacts within the electrically sensitive finger grippers. In this manner, each pin of a gripped component is individually connected to the test signal gating 32, the compare circuit 36 and the ground and current input assignment circuit 82. This allows for the impression of a bilevel test signal condition or the establishment of a ground or current condition on any given pin of a gripped component. This moreover allows for a sensing of the signal condition present on the pin at any given time.

Referring to FIG. 6, the test signal gating 32 is illustrated in detail. It will be remembered that the test signal gating 32 is operative to receive a set of bilevel test signal conditions via a bus 66 from the truth table register 58. It will furthermore be remembered that the test signal gating also receives a set of input assignment signals from the input assignment register 54 via the bus 68. The individual lines within the buses 66 and 68 are labeled in FIG. 6 with hyphenated labels bearing the prefix of the respectively numbered bus. These hyphenated labels moreover have suffix portions numbered "1" to "n". This represents the number of lines in each bus that will be needed to transmit the "n" bilevel signals from the respective upstream registers 54 and 58. In this regard, each bilevel signal from the truth table register 58 will define an input or output condition for a particular pin of the DIP which is to be tested. These input or output conditions will be binary in nature so as to signify either a binary one or a binary zero. The particular combination of all these binary conditions will be the particular truth table for the particular test. Each bilevel signal from the input assignment register 54 will define whether the particular pin is to be treated as an input pin. In this manner, each pin of a gripped component within the electrically sensitive finger grippers is dealt with by appropriate bilevel signals emanating from the registers 54 and 58.

The test signal gating of FIG. 6 is seen to comprise a plurality of gating amplifiers denoted as 124-1 through 124-n. Each one of the gating amplifiers is operative to gate a test signal appearing on a respective input line 68-1 through 68-n when appropriately enabled by an input assignment signal appearing on a respective input line 66-1 through 66-n. The resulting test signals appear on the respective output lines 70-1 through 70-n. It is to be understood that each one of the output lines 70-1 through 70-n constitutes one of the lines of the bus 70 of FIG. 3. Each of these output lines will moreover appear as a line similar to the lead 118 into the spring biased contact 112 of FIG. 5c.

Referring now to FIG. 7, the compare circuit 36 is illustrated in detail. In particular, the compare circuit is seen to receive input signals from the electrically sensitive finger grippers 34 via the input lines 88-1 through 88-n. These lines form the bus 88 of FIG. 6 and moreover correspond to the lines such as 120 exiting from particular spring biased contacts in FIG. 5c.

The compare circuit also receives the component configuration signal from the central processor via the input line 38. This component configuration signal will be logically low whenever the component under test has open collector outputs. The logically low signal will be inverted through an amplifier 126 so as to actuate the base of a transistor 128 thereby causing current to flow through a resistor 130 and a diode 132. This allows the sensing of the open collector outputs by operational amplifiers 134-1 through 134-n. It is to be understood that the aforementioned circuitry will not be activated when the component under test does not have open collector outputs. In any event, the output signal condition of each operational amplifier 134-1 through 134-n is applied to one side of a standard comparator 136. The opposite side of the comparator 136 receives a set of expected bilevel test conditions via a set of input lines 89-1 through 89-n. These latter input lines constitute the internal lines within the bus 89 of FIG. 3. The expected bilevel test conditions in these lines will conform to the truth table of binary conditions prescribed for the particular test which is thus being conducted.

As has been previously discussed with regard to FIG. 3, the comparator circuit 136 is operative to make a comparison in response to a compare authorization signal occurring on the line 42. The result of the comparison is a bilevel signal output on the line 44. This signal is applied to the central processor 46 as the comparison result signal.

Referring to FIG. 8, the current generator 80 is illustrated in detail. The current generator receives three separate bilevel signals via the lines 74-1 74-2 and 74-3 which form the port bus 74 of FIG. 3. A logically low signal condition on any one of the bilevel signal inputs will be inverted through a respective amplifier 138-1, 138-2 and 138-3 so as to thereby activate the base of a particular transistor 140-1, 140-2 or 140-3. The transistor which is thus rendered conductive will pull current from a voltage source $V_s$ down through its upstream resistor. It is to be appreciated that the particular current which is thus defined is dictated by the value of the upstream resistor 142-1, 142-2, or 142-3. In each instance, the current thereby defined will exit on the line 84 which is connected to the ground and current input assignment circuit.

Referring now to FIG. 9, the ground and current input assignment circuit 82 is illustrated in detail. The selected current from the current generator is present on the line 84 which is connected to a plurality of current input assignment circuits 144-1 through 144-n. Each of the respective current input assignment circuits 144-1 through 144-n receive a bilevel signal input via a respective line 76-1 through 76-n. Each of the input lines 76-1 through 76-n form part of the port bus 76 of FIG. 3. Only one of these particular lines will be logically high so as to thereby enable the particular current input assignment circuit 144-1 through 144-n. This logically high signal will actuate the base of a transistor such as 146 in the current input assignment circuit 144-1. The current from the input line 84 will hence flow onto the output line 86-1 which forms part of the bus 86 of FIG. 3. As has been previously discussed with regard to FIG. 5c, the various lines within the bus 86 are connected to respective spring biased contacts such as 112 via lines such as 122. In this manner, a selected current is impressed on the particular input pin for the gripped component 90 of FIG. 5c.

Referring again to FIG. 9, a plurality of ground input select circuits 148-1 through 148-n are also commonly connected to the respective output lines 86-1 through 86-n. Each of these ground input assignment circuits receives a bilevel signal input via a respective input line 78-1 through 78-n. Only one of these bilevel input signals will be logically high so as to thereby cause sufficient current to flow through a diode such as 150 and hence actuate the base of a transistor such as 152 which thereby pulls the respective output line such as 86-1 to ground. The thus grounded output line will impress the ground condition on a particular pin lead of the gripped component 90. This will result in the gripped component being energized for the ensuing component test.

From the foregoing, it is to be appreciated that a preferred embodiment has been disclosed for the testing of electronic components prior to insertion within a component insertion machine. It is to be appreciated that alternative logic and apparatus may be substituted for elements of the preferred embodiment without departing from the scope of the present invention.

We claim:

1. A system for testing components that are to be automatically inserted by a component insertion machine, said system comprising:
   means, within the automatic control portion of said component insertion machine, for automatically identifying each component that is to be inserted by said component insertion machine;
   means, responsive to the identification of a component that is to be inserted, for automatically selecting at least one test for each such identified component;
   means, responsive to the automatic selection of a test, for applying at least one signal to an identified input on the component; and
   means for comparing the response of the component under test with an expected result.

2. The system of claim 1 further comprising:
   means for selectively defining the amount of power to be applied to the component under test; and
   means for applying the selectively defined amount of power to the component under test.

3. The system of claim 2 wherein said means for selectively defining the amount of power comprises:
   means for selecting one of a plurality of power conditions for the component under test.

4. The system of claim 3 wherein said means for applying the selectively defined amount of power to the component under test comprises:
   means for selectively defining an input on the component which is to receive the selected amount of power.

5. The system of claim 4 wherein said means for applying the selectively defined amount of power to the component under test further comprises:
   means for limiting the time in which the defined amount of power is applied to the component.

6. The system of claim 5 wherein said means for applying at least one signal to an identified input on the component comprises:
   means for generating a plurality of test signals dictated by the selected test; and
   means for selectively defining at least one input on the component which is to receive at least one of the plurality of generated test signals.

7. The system of claim 1 further comprising:
   means for gripping the component that is to be inserted, said gripping means comprising a plurality of means for contacting the inputs and outputs of the component.

8. The system of claim 7 further comprising:
   means for selecting one of a plurality of power conditions for the component; and
   means for applying the selected power condition to one of said plurality of means for contacting the inputs and outputs of the component.

9. The system of claim 7 wherein said means for applying at least one signal to an identified input comprises:
   a plurality of gating means for gating test signal conditions to the gripped component, said plurality of gating means being individually connected to said plurality of means for contacting the component.

10. The system of claim 1 wherein said system further comprises:
    means for processing the result of the comparison so as to suspend the insertion of the component in the event of a failure of the comparison test.

11. The system of claim 10 wherein said means for processing the result of the comparison comprises:
    means for defining the number of tests that are to be applied to the component;
    means for determining whether the defined number of tests have been completed; and
    means for implementing the next test when the defined number of tests have not been completed.

12. The system of claim 11 wherein said means for processing the result of the comparison further comprises:
    means for suspending execution of any further tests when a failure occurs in the comparison test.

13. The system of claim 1 further comprising:
    a pair of hinged finger grippers each having a plurality of rigid electrical contacts extending downwardly at the ends of the finger grippers, said plurality of rigid electrical contacts being operative to grip an electrical component for insertion into a receiving medium.

14. The system of claim 13 wherein said pair of finger grippers further comprises:

means for isolating each electrical contact from adjacent electrical contacts so as to define a plurality of isolated electrical contacts.

15. The system of claim 14 wherein said plurality of rigid electrical contacts each engages a pin extending from the component that is positioned between said pair of hinged finger grippers.

16. The testing system of claim 1 wherein said means for automatically selecting at least one test for each component comprises:
means for storing test information pertaining to the testing of each component, the test information relating to each component being stored in a plurality of addressable storage locations; and
means, responsive to the automatic identification of a component for addressing the storage locations containing the test information relating to the testing of the identified component that is to be inserted.

17. The system of claim 16 wherein the test information relating to the testing of each component defines at least two tests for each component and said means for addressing the storage locations containing the test information is operative to sequentially access the second test if the component passes the first test.

18. The system of claim 1 further comprising:
means for defining the type of component that is to be tested; and
means, responsive to the definition of the type of component to be tested for selectively defining the manner of sensing the response of the component under test.

19. In a component insertion machine wherein components are selected, tested and inserted, a testing system comprising:
means for electrically contacting the component while gripping the component preparatory for insertion into a receiving medium.
means for defining at least one test for each component, the test comprising a truth table consisting of binay input and binary output conditions for the component;
means for imposing the binary input conditions on predefined inputs of the component;
means for comparing the response of the component to the expected binary conditions; and
means for processing the result of the comparison so as to suspend the insertion of the component in the event of a failure of the comparison test.

20. The testing system of claim 19 wherein said means for electrically contacting the component while gripping the component comprises:
a plurality of individual electrical contacts each applying a gripping force on a respective portion of the component.

21. The testing system of claim 20 further comprising:
means for energizing the component following the imposition of the binary input conditions on predefined inputs of the component.

22. The testing system of claim 21 wherein the test for each component further comprises a designation as to the amount of power which the component is to be subjected to and wherein said means for energizing the component is responsive to generate the amount of power that is so designated.

23. The testing system of claim 22 wherein the test further comprises information identifying which of the plurality of individual electrical contacts is to transmit the power conditions, said system further comprising:
means for selectively transmitting the power condition to at least one electrical contact that has been designated by the test information.

24. The testing system of claim 20 wherein the test further comprises information identifying which of the plurality of individual electrical contacts are to transmit the binary input conditions and wherein said means for imposing the binary input conditions on predefined inputs of the component comprises:
means for selectively gating the binary input conditions in response to the information identifying which of the plurality of individual electrical contacts are to transmit the binary input conditions.

25. The testing system of claim 19 wherein said means for defining at least one test for each component comprises:
means for storing a plurality of tests said plurality of tests including at least one test for each electrical component that is to be inserted; and
means for accessing at least one stored test pertaining to the component which has been selected for insertion.

26. The testing system of claim 25 wherein said means for accessing at least one test comprises:
means within the automatic control portion of said component insertion machine for automatically identifying the component which is to be tested; and
means, responsive to the identification of the component for identifying where the test for the component is stored within said means for storing a plurality of tests.

27. The testing system of claim 26 wherein said means for accessing at least one test comprises:
means for defining the number of tests that are to be applied to the component;
means for determining whether the defined number of tests have been completed; and
means for accessing the next test when the defined number of tests have not been completed.

28. The testing system of claim 27 wherein said means for accessing at least one test further comprises:
means for suspending the accessing of any further tests when a failure occurs in the comparison test.

29. In a component insertion machine wherein DIP components are selected and inserted into a receiving medium, a system for testing each DIP component prior to insertion comprising:
means for individually electrically contacting each pin extending from a DIP component while gripping the component preparatory for insertion into a receiving medium;
means for imposing a set of test conditions on certain of the electrically contacted pins;
means for energizing the DIP component following the imposition of the set of test conditions; and
means for comparing the response of the DIP component with an expected set of test conditions.

30. The system of claim 29 wherein said means for energizing the DIP component comprises:
means for selecting one of a plurality of power conditions for the component under test; and
means for applying the selected power condition to at least one of the electrically contacted pins.

31. The system of claim 29 wherein said system further comprises:

means for processing the result of the comparison so as to suspend the insertion of the DIP component in the event of a failure of the comparison test.

32. The testing system of claim 29 wherein said means for selecting at least one test for each DIP component comprises:

means for storing test information pertaining to the testing of each DIP component, the test information relating to each DIP component being stored in separately definable storage locations; and means, responsive to an identification of the component to be inserted, for accessing the stored test information relating to the testing of a DIP component that is to be inserted.

33. The system of claim 32 wherein the test information relating to the testing of each DIP component defines at least two tests for each DIP component and said means for accessing the stored test information is operative to sequentially access the second test if the DIP component passes the first test.

* * * * *